United States Patent [19]
Ackley et al.

[11] Patent Number: 5,563,900
[45] Date of Patent: Oct. 8, 1996

[54] BROAD SPECTRUM SURFACE-EMITTING LED

[75] Inventors: Donald E. Ackley, Lambertville, N.J.; Paige M. Holm, Phoenix; Michael S. Lebby, Apache Junction, both of Ariz.

[73] Assignee: Motorola, Schaumburg, Ill.

[21] Appl. No.: 287,820

[22] Filed: Aug. 9, 1994

[51] Int. Cl.⁶ .............................. H01S 3/18; H01S 3/103
[52] U.S. Cl. ............................ 372/45; 372/96; 372/23; 257/97; 257/98
[58] Field of Search ........................ 372/23, 45, 46, 372/96; 257/89, 90, 96, 97

[56] References Cited

U.S. PATENT DOCUMENTS

| | | | |
|---|---|---|---|
| 5,212,706 | 5/1993 | Jain | 372/23 |
| 5,245,622 | 9/1993 | Jewell et al. | 372/45 |
| 5,337,327 | 8/1994 | Ackley | 372/45 |

*Primary Examiner*—Rodney B. Bovernick
*Assistant Examiner*—Robert McNutt
*Attorney, Agent, or Firm*—Eugene A. Parsons

[57] ABSTRACT

A surface emitting light emitting device with a semiconducting substrate, a semiconducting mirror stack positioned on the substrate surface, a spacer layer positioned on the mirror stack, an active region positioned on the spacer layer, a second spacer layer positioned on the active region, a second semiconducting mirror stack positioned on the second spacer layer, and a top contact layer positioned in contact with the second semiconducting mirror stack. The active region includes multiple quantum wells each having a different transition wavelength and positioned on the spacer layer with the quantum well possessing the longest transition wavelength located closest to the spacer layer and additional quantum wells of the multiple quantum wells positioned in order of decreasing transition wavelength so that the sum of the emission from all of the quantum wells results in a broad and uniform output emission spectrum.

26 Claims, 2 Drawing Sheets

5,563,900

BROAD SPECTRUM SURFACE-EMITTING LED

An efficient surface emitting light emitting diode (LED) with an extremely broad output spectrum is described.

BACKGROUND OF THE INVENTION

In general, semiconductor-based light sources such as light emitting diodes (LEDs) and semiconductor diode lasers have relatively narrow spectral outputs. There is a need, however, for devices with a broad spectral output for applications such as fiber-optic gyroscopes, chemical sensors, wavelength division multiplexing communications systems with passive drops, and displays. Attempts to achieve broad spectral outputs from diode lasers have generally either incorporated a number of quantum wells into the active regions of the device, or used high excitation levels to achieve transitions from more than one quantized level in combination with other broadening mechanisms that occur at high carrier densities. Generally those schemes, however have been implemented in edge emitting designs which result in significant costs due to the need to handle and package individual chips. The recent development of vertical cavity surface emitting lasers (VCSELs) which incorporate a resonant cavity produced using quarter wave Bragg mirror stacks has resulted in the demonstration of lasers that emit perpendicular to the substrate, alleviating many of the packaging and handling problems associated with diode lasers and reducing the operating current as well. VCSELs are inherently single frequency sources, however, and LEDs fabricated using structures similar to VCSELs have narrow spectral outputs as well. Thus there continues to be a need for a surface emitting light source with a broad spectral output.

It is the purpose of this invention to provide a new design for a surface emitting light emitting diode with broad spectral output and high efficiency.

SUMMARY OF THE INVENTION

The above problems and others are at least partially solved and the above purpose and others are realized in a resonant cavity for a surface emitting light emitting device with a semiconducting substrate, a semiconducting mirror stack positioned on the substrate surface, a spacer layer positioned on the mirror stack, an active region positioned on the spacer layer, a second spacer layer positioned on the active region, and a second semiconducting mirror stack positioned on the second spacer layer. The active region includes multiple quantum wells each having a different transition wavelength. In a preferred embodiment the multiple quantum wells are positioned on the spacer layer with the quantum well possessing the longest transition wavelength located closest to the spacer layer and additional quantum wells of the multiple quantum wells positioned in order of decreasing transition wavelength so that the sum of the emission from all of the quantum wells results in a broad and uniform output emission spectrum.

BRIEF DESCRIPTION OF THE DRAWING

Referring to the drawings.

DESCRIPTION OF THE PREFERRED EMBODIMENT

Figure 1:
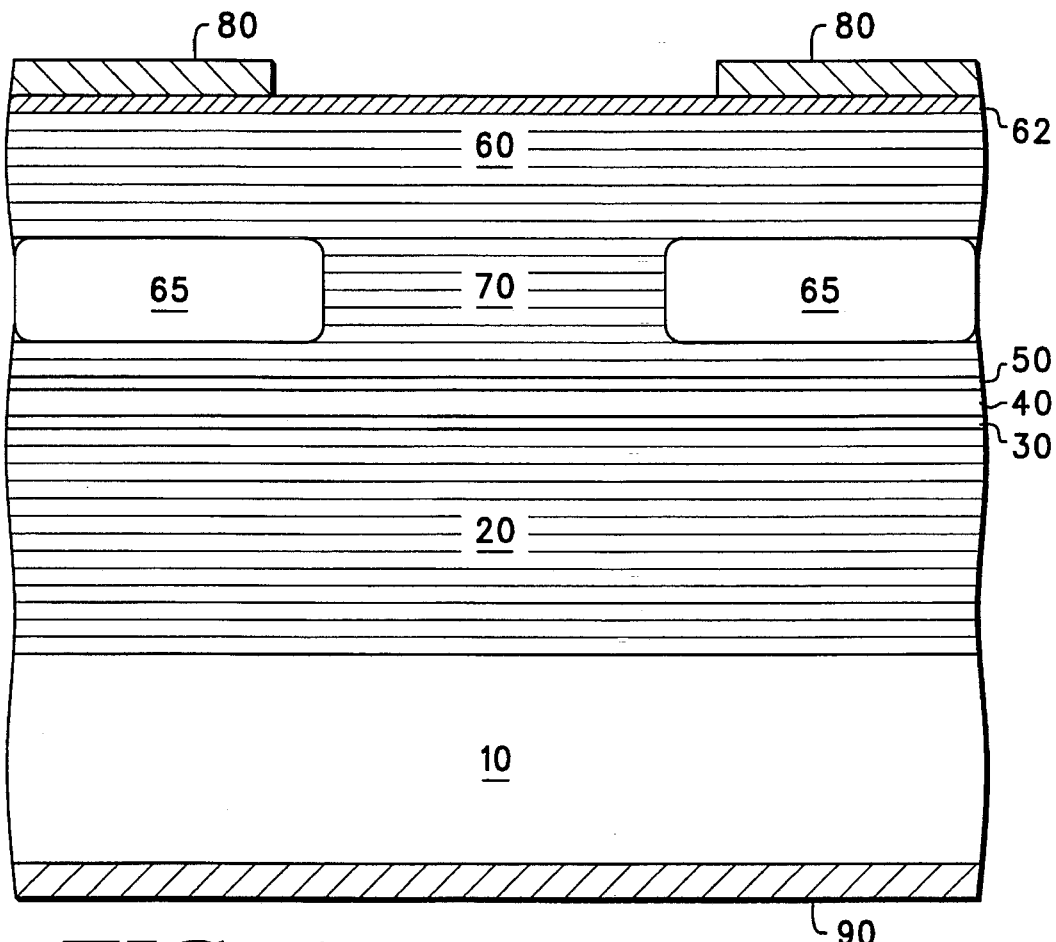
FIG. 1 is a simplified cross-sectional view of a broad spectrum surface emitting LED in accordance with the present invention.

Referring specifically to FIG. 1, an intermediate step in the fabrication of a surface emitting light emitting device, such as a light emitting diode (LED) or vertical cavity surface emitting laser (VCSEL) is illustrated. A substrate 10 is provided which in this embodiment is formed of GaAs and heavily doped to provide n-type conduction. A parallel bottom mirror stack 20 doped to provide n-type conduction is formed on the surface of the substrate. In this preferred embodiment the stack 20 is composed of alternating layers of AlAs and $Al_{0.4}Ga_{0.6}As$, each layer having a thickness equal to one quarter of the desired wavelength of operation propagating within said layer. An undoped parallel spacer layer 30 of composition $Al_{0.8}Ga_{0.2}As$ is then grown over stack 20. An active region 40 consisting of multiple quantum wells and barriers is then grown over spacer 30.

Figure 2:
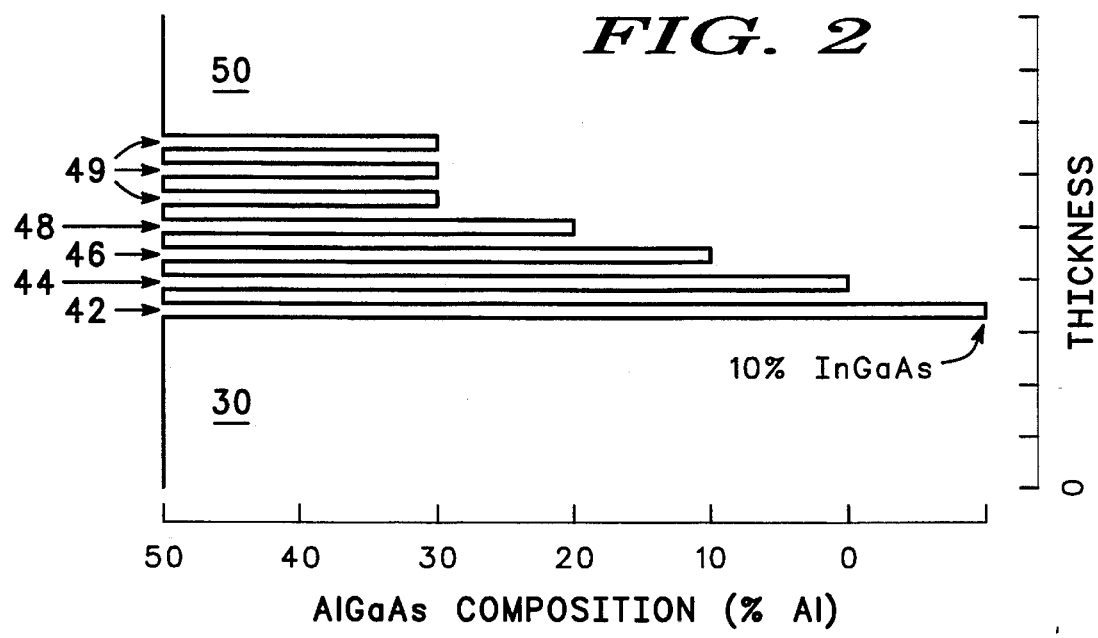
FIG. 2 shows the energy gaps of the quantum wells in the active region of the LED of FIG. 1.

The composition and/or the thickness of the quantum wells in active region 40 is varied so that the wavelengths of optical transitions within the quantum wells decrease with increasing distance from spacer layer 30. Referring specifically to FIG. 2, in the preferred embodiment a lowest well 42 is InGaAs of 10% indium (In) mole fraction, followed by a well 44 of GaAs, a well 46 of AlGaAs with 10% aluminum (Al) mole fraction, a well 48 of AlGaAs of 20% aluminum (Al) mole fraction, and finally one or more AlGaAs quantum wells 49 with 30% aluminum (Al) mole fraction. A barrier to carriers is positioned on either side of or between each of quantum wells 42, 44, 46, 48 and 49 in a manner which will be understood by those skilled in the art. Generally, as is known in the art, a barrier to carriers is a material with a relatively large bandgap. A top spacer layer 50 of composition $Al_{0.8}Ga_{0.2}As$ is then located on active region 40. Spacer layers 30 and 50 are constructed of material having an intermediate bandgap such as to allow the relatively free flow of carriers through active region 40. Again referring to FIG. 1, the top spacer layer is followed by a p-doped top mirror stack 60 that is composed of alternating layers of AlAs and $Al_{0.4}Ga_{0.6}As$, each layer of thickness approximately equal to ¼ of the wavelength of optical transitions within quantum wells 49. The device is completed with a heavily p-doped contact layer 62 of AlGaAs of 30% aluminum (Al) mole fraction.

A means of lateral current confinement is then formed, in this specific embodiment, by ion implantation 65 surrounding a central region 70 with no implantation. Ion implantation 65 comprises a proton bombarded region of high resistivity, but it could also include a region of implanted n-dopant such as silicon (Si) to provide a reverse-biased p-n junction and, thereby, block current flow. The implantation could be patterned by any of several means well known in the art. Specifically, a layer of photoresist is deposited and exposed in a manner to align the exposed regions to central region 70. After removal of the exposed region using conventional developing techniques, an Au implant mask is plated in the exposed region which subsequently forms the implant mask.

After implantation, a p-contact 80 is formed, using metals well known in the art such as TiPtAu or TiW, deposited by vacuum evaporation, sputtering, or chemical vapor deposition and conventional lift-off or etching techniques, on mirror stack 60 with a window aligned again to central region 70. An n-contact 90 is then formed on the back side of substrate 10 using conventional means comprising metallizations well known in the art such as Ge/Ni/Au, usually vacuum evaporated.

Figure 3:
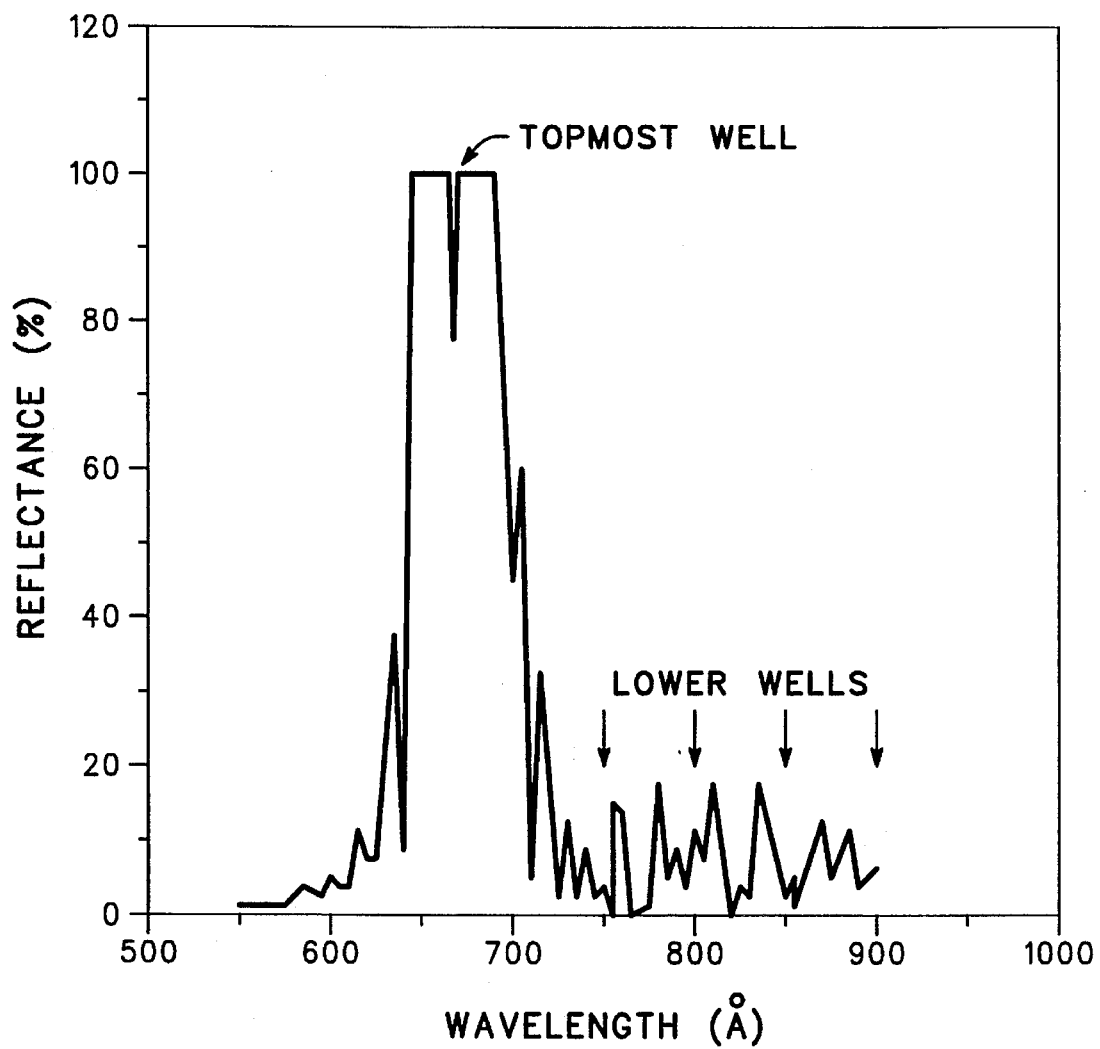
FIG. 3 shows a simulated reflectance spectrum of the LED of FIG. 1 with the resonant wavelength and pumped wavelengths displayed relative to the absorption spectrum.

Referring to FIG. 3, a simulated reflectance spectrum for the resonant cavity formed by bottom mirror stack 20, bottom spacer layer 30, active region 40, top spacer layer 50 and top mirror stack 60 as shown. The wavelength of the cavity resonance corresponds to the wavelength of emission from top-most quantum well, or wells, 49 in the active region, while the emission due to optical transitions from the other quantum wells 42, 44, 46, 48 in the active region is at longer wavelengths where the reflectance is low. Thus, as previously explained, emission of light at the wavelength of the top-most quantum wells 49 is minimum while emission of light at the wavelength of quantum wells 42, 44, 46 and 48 is maximum. The bottom and top mirror stacks 20 and 60, respectively, are designed with a relatively large reflectance so as to confine the emission from top-most quantum wells 49 to the resonant cavity, which substantially improves the efficiency of the diode by the optical pumping of the other quantum wells 42, 44, 46, 48. For sufficiently high injection current the surface emitting light emitting diode is designed so that the diode reaches lasing threshold at the transition wavelength of topmost quantum well 49. The surface emitting light emitting diode is further constructed so that the transitions in quantum wells 42, 44, 46, 48 below topmost well 49 are optically pumped by the lasing action and the efficiency of the diode is substantially improved by the optical pumping of the lasing action. Further, the top and bottom mirror stacks are designed with a relatively large reflectance, including forming top mirror stack 20 with sufficient pairs of alternating layers of materials with high and low refractive index to prevent significant emission from the lasing action from coupling out through the second mirror stack, chosen so as to reduce the lasing threshold and prevent lasing emission from being efficiently coupled outside the resonant cavity.

While the description incorporated herein describes the fabrication of a single LED, it is understood that substrate 10 may be a whole semiconductor wafer, and that thousands of LEDs as described there could be fabricated simultaneously.

A surface emitting light emitting diode is disclosed which incorporates a multiple quantum well active region with variations in the wavelength of the optical emission from each well. The LED is constructed using epitaxial growth techniques such as metalorganic vapor phase epitaxy (MOVPE) or molecular beam epitaxy (MBE) and the transition wavelengths of the quantum wells are varied by changing the composition and/or thickness of each well. Simulations show that for a top quantum well aligned to the resonant wavelength of the cavity, the transition wavelengths of the other quantum wells are easily chosen to be outside the reflectance of the resonant cavity for efficient output coupling.

Quantum wells 42, 44, 46, 48 and 49 in active region 40 have transition energies that increase with the distance from bottom spacer layer 30 in such a manner that the optical emission from each quantum well overlaps to form a broad and continuous output spectrum. For all wells except topmost quantum well 49, the wavelength of the optical emission is located outside the reflectance band of the resonant cavity formed by lower and upper quarter wave Bragg mirror stacks 20 and 60 so that the optical emission is readily coupled out of the device. The emission wavelength of topmost quantum well 49 is chosen to correspond to the resonant wavelength of the optical cavity. As a result, its emission is confined to the optical cavity with very little coupling to the outside world, leading to a very high optical intensity at the resonant wavelength. The device may even reach lasing at the resonant wavelength under certain drive conditions. All the quantum wells below the topmost one (or plurality of topmost ones) have smaller bandgaps than topmost well 49, and as a result the emission from topmost well 49 is strongly absorbed by each well located below it. The absorbed emission is then re-emitted at the longer wavelength corresponding to the transition wavelength of the transition wavelength of the respective quantum well, resulting in substantially improved device efficiency due to the photon recycling. In the preferred design, every quantum well optically pumps the one below it, resulting in large improvements in efficiency.

The combination of high efficiency and a broad and continuous output spectrum is a large improvement over conventional LED designs. The devices are easily fabricated using technologies well known in the art, and have surface emitting geometry well-suited for on-wafer testing, ease of packaging and incorporation into arrays.

Thus, a surface emitting light emitting device is described wherein the active region is designed to receive current injected therein and excite transitions in the quantum wells, resulting in optical emission and wherein each successive quantum well in active region 40 below top spacer layer 50 is designed to optically pump the transitions in the quantum wells below it thereby substantially improving the efficiency. The efficiency is substantially improved by optical pumping of the lower quantum wells by the resonantly enhanced emission from the topmost quantum well. Further, the surface emitting light emitting diode is constructed so that the sum of the emission from all the quantum wells in the active region results in a broad and uniform output emission spectrum substantially greater in width than any of the individual output spectra.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A resonant cavity structure for a surface emitting light emitting device having an emission spectrum, the structure comprising:

a semiconducting substrate of a first conductivity type having a surface;

a first semiconducting mirror stack of the first conductivity type positioned on the substrate surface;

a first spacer layer positioned on the first mirror stack;

an active region comprising multiple quantum wells with each of the multiple quantum wells having a different transition wavelength; and a second spacer layer positioned on the active region; a second semiconducting mirror stack of a second conductivity type positioned on the second spacer layer.

2. A surface emitting light emitting device having an emission spectrum, the device comprising:

a semiconducting substrate of a first conductivity type having a surface;

a first semiconducting mirror stack of the first conductivity type positioned on the substrate surface;

a first spacer layer positioned on the first mirror stack;

an active region comprising multiple quantum wells with each of the multiple quantum wells having a different transition wavelength, the multiple quantum wells being positioned on the first spacer layer with a quantum well possessing the longest transition wavelength located closest to the first spacer layer, and additional quantum wells of the multiple quantum wells positioned in order of decreasing transition wavelength;

a second spacer layer positioned on the active region;

a second semiconducting mirror stack of a second conductivity type positioned on the second spacer layer; and a top contact layer of the second conductivity type positioned in contact with the second semiconducting mirror stack.

3. The surface emitting light emitting device of claim 2 wherein the first mirror stack and the second mirror stack each have a reflectance spectrum with a wavelength range of maximum reflectance centered about the transition wavelength of a quantum well positioned farthest from the first spacer layer.

4. The surface emitting light emitting device of claim 3 wherein the first mirror stack, the first spacer layer, the active region, the second spacer layer, and the second mirror stack form a resonant cavity with a resonance wavelength approximately equal to the transition wavelength of the quantum well positioned farthest from the first spacer layer.

5. The surface emitting light emitting device of claim 4 wherein the top and bottom mirror stacks are designed with a relatively large reflectance chosen so as to reduce the lasing threshold and prevent lasing emission from being efficiently coupled outside the resonant cavity.

6. The surface emitting light emitting device of claim 4 wherein each successive quantum well in the active region below the second spacer layer is designed to optically pump transitions in a quantum well therebelow, thereby substantially improving the efficiency of the diode.

7. The surface emitting light emitting device of claim 3 wherein all quantum wells in the active region except the quantum positioned farthest from the first spacer layer well have transition wavelengths longer than the wavelength range of maximum reflectance.

8. The surface emitting light emitting device of claim 3 wherein the first and second conductivity type are p-type and n-type, respectively, and current is injected into the active region from a junction defined by the first and second mirror stacks.

9. The surface emitting light emitting device of claim 2 including in addition a resistive region formed in the second mirror stack completely surrounding a central region without an implant to confine the injected current to the central region.

10. The surface emitting light emitting device of claim 9 wherein the resistive region is formed in the second mirror stack by ion implantation.

11. The surface emitting light emitting device of claim 9 wherein the resistive region includes an implanted region of opposite conductivity type to the top mirror stack.

12. The surface emitting light emitting device of claim 2 including in addition a barrier positioned between each of the quantum wells in the active region.

13. The surface emitting light emitting device of claim 12 wherein the barriers have a bandgap which is large relative to a bandgap of the quantum wells and the first and second spacer layers have a bandgap at least as large as the bandgap of the barriers.

14. A method for fabricating a resonant cavity for a surface emitting light emitting device comprising the steps of:

providing a semiconducting substrate of a first conductivity type having a major surface;

forming a first semiconducting mirror stack of the first conductivity type on the major surface of the substrate;

forming a first spacer layer on the first mirror stack;

forming an active region of multiple quantum wells with different transition wavelengths and positioning the multiple quantum wells on the first spacer layer;

forming a second spacer layer on the active region; and forming a second semiconducting mirror stack of a second conductivity type on the second spacer layer.

15. A method for fabricating a surface emitting light emitting device comprising the steps of:

providing a semiconducting substrate of a first conductivity type having a major surface;

forming a first semiconducting mirror stack of the first conductivity type on the major surface of the substrate;

forming a first spacer layer on the first mirror stack;

forming an active region of multiple quantum wells with different transition wavelengths and positioning the multiple quantum wells on the spacer layer in such a manner that a quantum well possessing the longest transition wavelength is located closest to the spacer layer and the additional quantum wells are positioned in order of decreasing transition wavelength;

forming a second spacer layer on the active region;

forming a second semiconducting mirror stack of a second conductivity type on the second spacer layer; and forming a top contact layer of the second conductivity type in contact with the second mirror stack.

16. The method of claim 15 including in addition the step of determining the transition wavelengths of the quantum wells in the active region by varying the alloy composition of the quantum wells.

17. The method of claim 15 including in addition the step of determining the transition wavelengths of the quantum wells in the active region by varying the thickness of the quantum wells.

18. The method of claim 15 including in addition the step of forming the first and second mirror stacks by a plurality of pairs of alternating layers of materials with a high and low refractive index for each of the pairs of alternating layers and further forming the mirror stacks so that each of the alternating layers in a pair has a thickness one-quarter of the wavelength corresponding to the transition wavelength of a topmost quantum well located in the active region furthest from the first spacer layer, propagating in the alternating layer.

19. The method of claim 18 including in addition the step of varying the reflectance of the first and second mirror stacks by varying the number of pairs in the mirror stack.

20. The method of claim 19 wherein the step of varying the reflectance of the first and second mirror stacks includes varying the number of pairs in the first and second mirror stacks to allow lasing action at the transition wavelength of the topmost quantum well in the active region.

21. The method of claim 20 wherein the step of varying the reflectance of the first and second mirror stacks includes forming a plurality of mirror pairs in the second mirror stack sufficiently large to prevent significant emission from the lasing action from coupling out through the second mirror stack.

22. The method of claim 18 wherein the step of forming the first and second mirror stacks by a plurality of pairs of alternating layers of materials includes forming the alternating layers of aluminum gallium arsenide with low and high aluminum mole fractions.

23. The method of claim 18 wherein the step of forming the first and second mirror stacks by a plurality of pairs of alternating layers of materials includes forming the alternating layers of indium aluminum phosphide and indium gallium phosphide.

24. The method of claim 15 including in addition the step of forming a resistive region in the second mirror stack completely surrounding a central region to confine injected current to the central region.

25. The method of claim 24 wherein the step of forming a resistive region includes implanting a resistive region in the second mirror stack substantially surrounding a central region without an implant to confine injected current to the central region.

26. The method of claim 25 wherein the step of forming a resistive region includes forming a region of opposite conductivity type in the second mirror stack to confine injected current to the central region.

* * * * *